United States Patent [19]
Morikawa et al.

[11] Patent Number: 5,637,510
[45] Date of Patent: Jun. 10, 1997

[54] METHOD FOR FABRICATING SOLAR CELL

[75] Inventors: Hiroaki Morikawa; Hisao Kumabe, both of Amagasaki, Japan

[73] Assignee: Mitsubishi Denki Kabushiki Kaisha, Tokyo, Japan

[21] Appl. No.: 596,414

[22] Filed: Feb. 2, 1996

Related U.S. Application Data

[62] Division of Ser. No. 352,118, Dec. 1, 1994, Pat. No. 5,510,272.

[30] Foreign Application Priority Data

Dec. 24, 1993 [JP] Japan .................. 5-326559

[51] Int. Cl.$^6$ .................................. H01L 31/18
[52] U.S. Cl. .................. 438/98; 136/256; 438/97; 438/958
[58] Field of Search ............. 437/2, 4, 10, 24, 437/974; 148/DIG. 135, DIG. 153; 136/256

[56] References Cited

U.S. PATENT DOCUMENTS 5,472,885  12/1995  Matsuno et al. .............. 136/256

FOREIGN PATENT DOCUMENTS 0100467  6/1983  Japan .............. 437/2

OTHER PUBLICATIONS

Schmidt et al, "Improved Efficiencies Of Semiconductor And Metallurgical Grade Cast Silicon Solar Cells By Hydrogen Plasma Treatment", Sixteenth IEEE Photovoltaic Specialists Conference, 1982, pp. 537–542.

Yagi et al, "Hydrogen Passivation Of Large–Area Polycrystalline Silicon Solar Cells By High–Current Ion Implantation", Twentieth IEEE Photovoltaic Specialists Conference, 1988, pp. 1600–1603.

Primary Examiner—Tuan H. Nguyen
Attorney, Agent, or Firm—Leydig, Voit & Mayer

[57] ABSTRACT

In a method of producing a solar cell, a photovoltaic thin semiconductor crystalline film is formed on an underlying substrate and hydrogen passivated throughout the film thickness direction of the photovoltaic film whereby a high efficiency solar cell is obtained. In addition, since the passivation process is performed before forming a rear surface electrode on the thin semiconductor crystalline film, the passivation process is not limited by the rear surface electrode. Thereby, a solar cell having a higher energy conversion efficiency is obtained. The passivation process is performed by exposing the thin semiconductor crystalline film to a hydrogen ion ambient having a low acceleration energy, below 2 KeV, or to a plasma ambient. Therefore, the uniformity of the passivation process at a wafer surface is improved and a large area wafer can be efficient processed. Furthermore, the passivation process can be performed to a plurality of solar cells having the thin semiconductor crystalline films and arranged in a module.

4 Claims, 5 Drawing Sheets

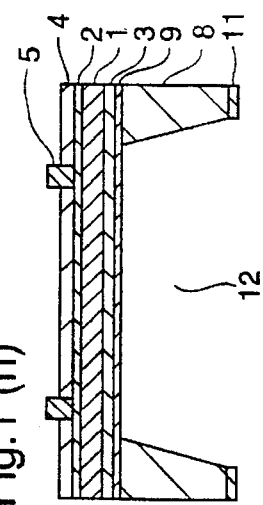
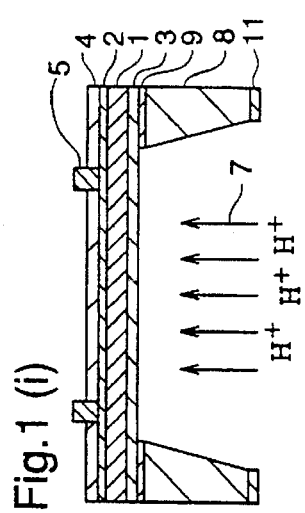
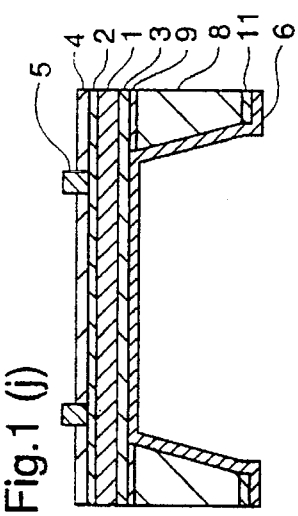
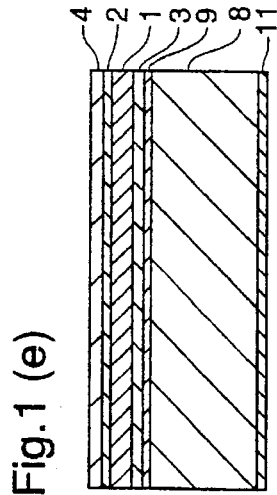
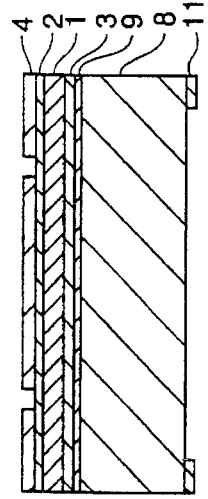
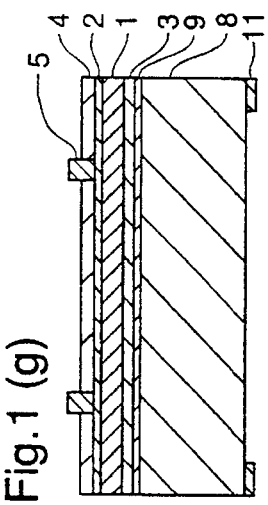
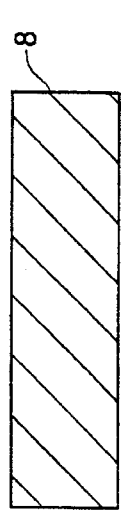
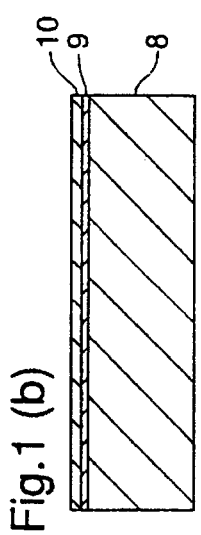
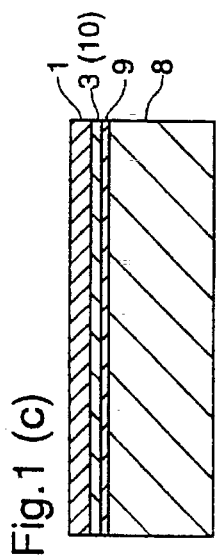
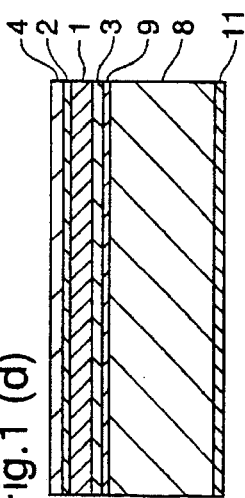

| procedure | passivation before producing a back electrode | passivation from surface after producing solar cell | passivation from rear surface after producing solar cell |
|---|---|---|---|
| improvement ratio (%) | 32 | 21 | 4 |

Fig.6 (a) Prior Art
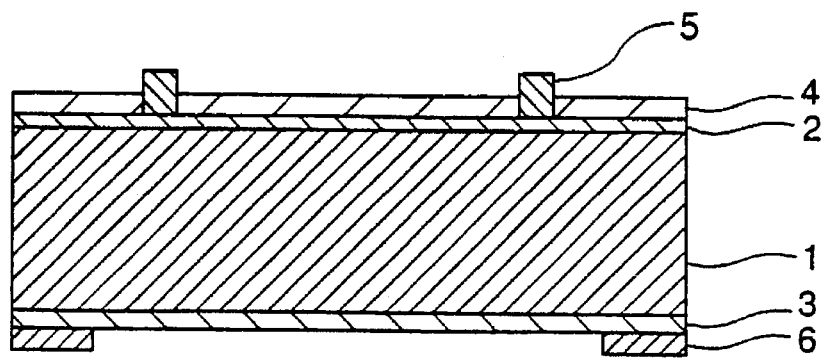
Fig.6 (b) Prior Art
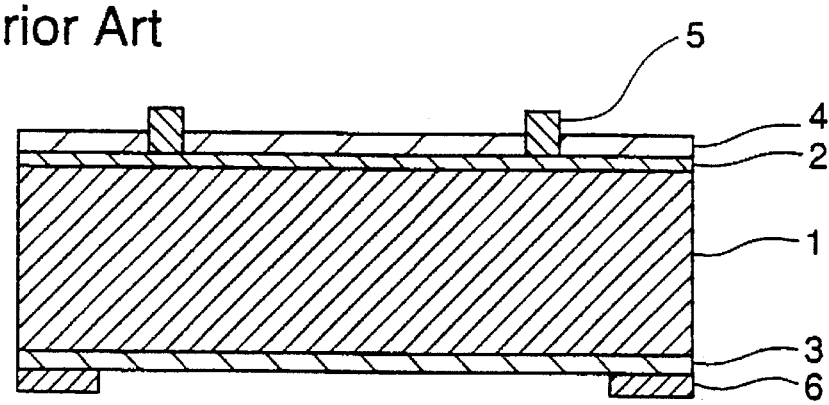
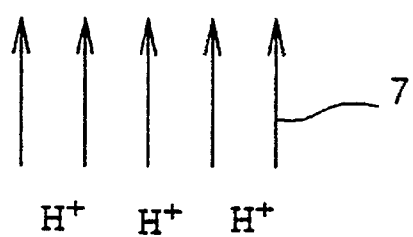

METHOD FOR FABRICATING SOLAR CELL

This disclosure is a division of patent application Ser. No. 08/352,118, filed Dec. 1, 1994, now U.S. Pat. No. 5,510,272.

FIELD OF THE INVENTION

The present invention relates to a method of producing a solar cell and, more particularly, to performing hydrogen passivation of crystal grain boundaries and defects so as to improve energy conversion efficiency of a thin polycrystalline silicon solar cell.

BACKGROUND OF THE INVENTION

FIG. 6(a) is a cross-sectional view illustrating a prior art polycrystalline Si solar cell, for example, as shown in "20TH IEEE PHOTOVOLTAIC SPECIALISTS CONFERENCE 1988 Technical Digest pp1600–1603", and FIG. 6(b) is a conceptual view of hydrogen passivation of the polycrystalline Si solar cell. In the figure, reference numeral 1 designates a p type polycrystalline Si layer. An n type diffusion layer 2 is formed on a light receiving surface of the p type polycrystalline Si layer 1. A high dopant impurity concentration p type layer 3 is disposed on a rear surface of the p type polycrystalline Si layer 1. An anti-reflection film 4 is disposed on an upper surface of the n type diffusion layer 2. A surface electrode 5 is located at apertures in the anti-reflection film 4 which is patterned on the upper surface of the n type diffusion layer 2. A lattice shaped rear surface electrode 6 is located on a rear surface of the high concentration p type layer 3. Reference numeral 7 designates hydrogen ions irradiating the rear surface of the polycrystalline Si solar cell.

A description is given of a method for producing a polycrystalline Si solar cell employing hydrogen passivation.

Thermal diffusion of phosphorus into the light receiving surface of the p type polycrystalline Si layer 1 forms n type diffusion layer 2 about 400 μm thick and junction at an interface with the Si layer 1. Subsequently, Al paste is applied to the rear surface of the p type polycrystalline Si layer 1 by screen printing and it is sintered, whereby a high dopant impurity concentration p type layer 3 is produced. The excess Al paste is removed with an acid etchant.

Thereafter, the surface electrode 5 is produced on the n type diffusion layer 2 by sintering an Ag paste formed by screen printing, and the lattice-shaped rear surface electrode 6 is formed on the rear surface by sintering an Ag paste formed by screen printing. Titanium dioxide (TiO$_2$) is deposited by atmospheric pressure CVD on the n type diffusion layer 2 at the light receiving surface, whereby the anti-reflection film 4 is produced. Finally, hydrogen ions 7 are implanted into the rear surface of the polycrystalline Si solar cell that is formed as described above in an ion implantation apparatus having an acceleration energy of 2 ~10 KeV, thereby achieving hydrogen passivation. Hydrogen is engaged with dangling bonds of the semiconductor, i.e., the polycrystalline Si layer 1, by hydrogen passivation, whereby the crystal grain boundaries and surface defects of the polycrystalline Si layer 1 are electrically inactivated, and the energy conversion efficiency of the solar cell is improved from 14.4% to 15.2%.

In the prior art method for producing a solar cell as described above, the hydrogen passivation penetrates to only one hundred μm from the rear surface of the solar cell because the polycrystalline Si layer is thick, and the effect of hydrogen passivation does not sufficiently reach the depletion layer at the junction. Thus, the improvement in the energy conversion efficiency only amounts to, at most 7–8% even in a solar cell having an energy conversion efficiency larger than 10% before the hydrogen passivation. In addition, because the hydrogen passivation is performed after forming a rear surface electrode, the hydrogen passivation is not effected at more than 20% of the entire rear surface area of the polycrystalline Si layer on which portion the rear surface electrode is formed.

SUMMARY OF THE INVENTION

It is an object of the present invention to provide a polycrystalline Si solar cell having a high energy conversion efficiency because of hydrogen passivation over the entire region in the film thickness direction of the polycrystalline Si even at a portion of the polycrystalline Si layer where the rear surface electrode is present, thereby improving the energy conversion efficiency by more than 20%.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, in a method of producing a solar cell, a thin semiconductor crystalline film serving as a photovolatic layer is formed on an underlying substrate, a prescribed portion of a underlying substrate is etched and removed so that the thin semiconductor crystalline film is produced, and a passivation process for passivating dangling bonds is performed to the exposed thin semiconductor crystalline film. Therefore, a thin photovoltaic layer is produced, and the hydrogen passivation reaches the entire region in the film thickness direction of the photovoltaic layer.

According to a second aspect of the present invention, the passivation process is performed before forming the rear surface electrode on the thin semiconductor crystalline film. Therefore, the passivation process is not limited by the rear surface electrode.

According to a third aspect of the present invention, in a method of producing a solar cell, a thin semiconductor crystalline film serving as a photovoltaic layer is formed on an underlying substrate via an insulating film which can be selectively etched relative to the thin semiconductor crystalline film, a throughhole is formed at a prescribed portion of the thin semiconductor crystalline film to expose the insulating film, an etchant is brought into contact with the insulating film through the throughhole to etch and remove the insulating film, thereby separating the thin semiconductor crystalline film from the underlying substrate, and a passivation process for passivating dangling bonds is performed from the opposite side to the light receiving surface of the thin semiconductor crystalline film. Therefore, a thin photovoltaic layer is produced, and the hydrogen passivation reaches the entire region in the film thickness direction of the photovoltaic layer.

According to a fourth aspect of the present invention, the passivation process is performed before forming the rear surface electrode on the thin semiconductor crystalline film. Therefore, the passivation process is not limited by the rear surface electrode.

According to a fifth aspect of the present invention, the passivation process is performed by exposing the thin semiconductor crystalline film to a plasma ambient. Therefore, the uniformity of the passivation process in the wafer surface is improved.

According to a sixth aspect of the present invention, the passivation process is performed to plurality of solar cells having the thin semiconductor crystalline films arranged for modularization. Therefore, a processing of large quantity of cells can be performed.

BRIEF DESCRIPTION OF THE DRAWINGS

FIGS. 1(a)–1(j) are cross-sectional views illustrating a process of producing a thin Si solar cell according to a first embodiment of the present invention.

FIGS. 6(a) and 6(b) are a cross-sectional view illustrating a solar cell having a semiconductor layer more than 170 μm thick and a conceptual view of the hydrogen passivation process, respectively.

DETAILED DESCRIPTION OF THE PREFERRED EMBODIMENTS

Figures 2, 3:
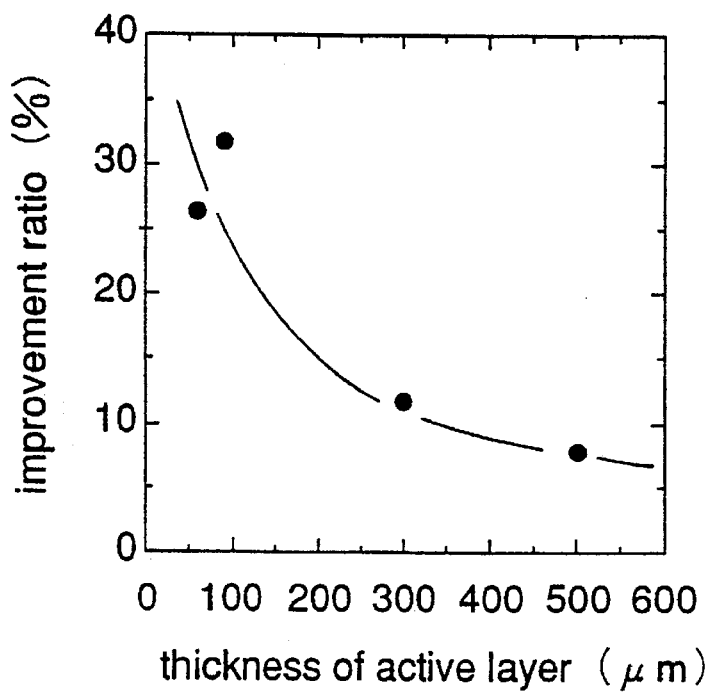
FIG. 2 is a diagram illustrating a relation between the improvement ratio of solar cells and the thickness of the active layer for solar cells produced in accordance with the first embodiment.
FIG. 3 is a diagram illustrating improvement ratio of the energy conversion efficiency achieved by hydrogen passivation depending on different process steps of hydrogen passivation in a production method according to the first embodiment.

A description is given of a production method according to a first embodiment of the present invention. FIGS. 1(a)–1(j) illustrate a process for forming a thin polycrystalline Si solar cell comprising a polycrystalline Si layer less than 150 μm thick, including forming a pn junction. In the figures, reference numeral 8 designates a Si supporting substrate, reference numeral 9 designates an insulating film formed on the entire surface of the Si supporting substrate 8, reference numeral 10 designates a zone-melting recrystallization layer formed on the entire surface of insulating film 9, reference numeral 11 designates a patterning insulating film for patterning the supporting substrate in a lattice shape, reference numeral 12 designates a rear surface aperture formed by etching the supporting substrate 8.

A description is given of a production method of the thin polycrystalline Si solar cell which is hydrogen passivated. The insulating film 9 is produced on the entire surface of the supporting substrate 8 shown in FIG. 1(a) by CVD or thermal oxidation. Furthermore, an Si layer having a fine grain size is produced on the surface of the insulating film 9 by atmospheric pressure CVD and the grain size is increased by zone-melting recrystallization, whereby a zone-melted recrystallized layer 10 is formed (FIG. 1(b)). Then, a crystalline layer having a comparatively large grain size is formed continuously with the large grain crystalline layer 10. When a high dopant impurity concentration p type layer is employed as the zone-melted recrystallized layer 10 in advance, the crystalline layer 10 serves as the high dopant impurity concentration p type layer 3, and the p type thin polycrystalline Si layer 1 is formed thereon by atmospheric pressure CVD. The film thickness totaling the high concentration p type layer 3 and the p type thin polycrystalline Si layer 1 is below 150 μm (FIG. 1(c)).

An n type diffusion layer 2 is formed on the light receiving surface of the p type thin polycrystalline Si layer 1 by thermal diffusion, a SiN film is formed on the n type diffusion layer 2 as the anti-reflection film 4 by reduced pressure CVD, and a SiN film for patterning is formed on the entire rear surface of the supporting substrate 8 by reduced pressure CVD (FIG. 1(e)).

Subsequently, the anti-reflection film 4 is patterned using an acid resistant resist. At the same time the lattice-shaped patterning is performed at the rear surface of the supporting substrate 8 by employing the acid resistant resist, and the lattice-shaped patterning insulating film 11 is formed (FIG. 1(f)). Subsequently, Ag paste is formed in the region where the n type diffusion layer 2 is exposed by screen printing and sintered, thereby the electrode 5 is produced (FIG. 1(g)).

Alkaline resistant wax having a melting point of 150°~230° C. is deposited on the surface of the substrate where the surface electrode 5 is formed. A glass or a SUS substrate is applied to cover and protect the surface of the substrate, it is immersed in the KOH solution of several tens wt % and etched, whereby the insulating film 9 is exposed, leaving a region of the rear surface of the supporting substrate 8 on which in the lattice shape patterned insulating film 11 is formed (FIG. 1(h)). In the etching of the Si supporting substrate 8 and the insulating film 9, the Si supporting substrate 8 is etched several hundreds of times faster than the insulating film 9 in the above-described KOH solution so that etching is stopped when the insulating film 9 is exposed. Thereby, the insulating film 9 also serves as an etch stopping layer for the KOH solution.

As shown in FIG. 1(i) the exposed portion of the insulating film 9 is etched and removed with HF and the glass or SUS substrate attached to the substrate is removed. The hydrogen ion (H$^+$) implantation is performed at a low acceleration voltage for the high dopant impurity concentration p type layer 3 which is exposed. A sufficient effect can be obtained by performing the ion implantation as an accelerating voltage of 500 eV~2000 eV, a current density of 0.1 mA/cm$^2$~1.0 mA/cm$^2$, and an irradiation time within 30 minutes. The hydrogen dose in the substrate is $10^{18}$~$10^{19}$/cm$^2$. Finally, an aluminum film is formed on the entire rear surface of the substrate by evaporation or screen printing, and it is sintered at a low temperature, below 400° C., to form a rear surface electrode 6.

A description is given of the function and the effect. As shown in FIG. 2, the hydrogen passivation in the process for producing the polycrystalline Si solar cell provides an improved energy conversion efficiency, improved by more than 20%, by reducing the substrate thickness to less than 150 μm. To addition, it is most effective to perform hydrogen passivation before forming the rear surface electrode 6 as above-described, as is apparent from FIG. 3.

While in this embodiment, the insulating film 9 is employed as a stop during etching of the Si supporting substrate 8 as the underlying substrate, if the underlying substrate which can be selectively etched relative to the high dopant impurity concentration p type layer 3, it is not necessary to provide the insulating film 9 as a stopper.

A description is given of a method of producing a solar cell according to a second embodiment of the present invention. In the above-described embodiment, when the supporting substrate 8 is etched, a portion thereof remains.

Figure 4:
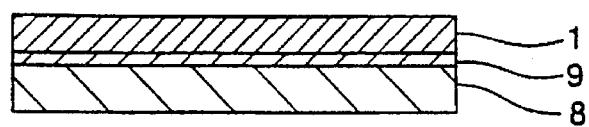
FIGS. 4(a)–4(h) are cross-sectional views illustrating a process of producing a thin Si solar cell according to a second embodiment of the present invention.
Figure 4:
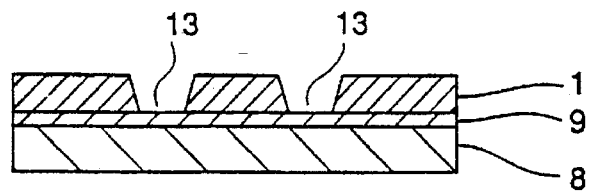
Figure 4:
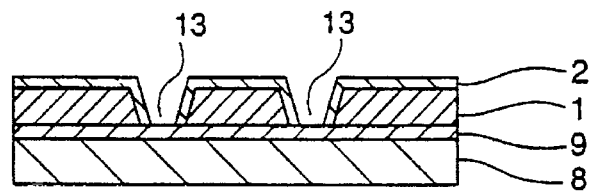
Figure 4:
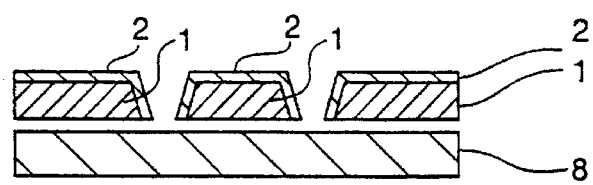
Figure 4:
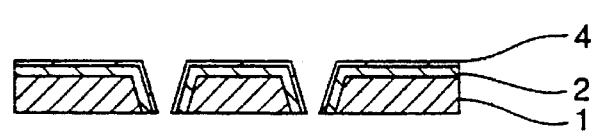
Figure 4:
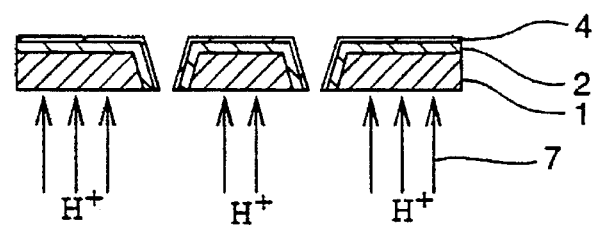
Figure 4:
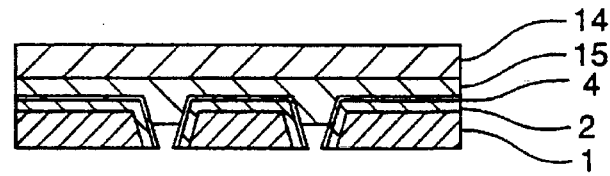
Figure 4:
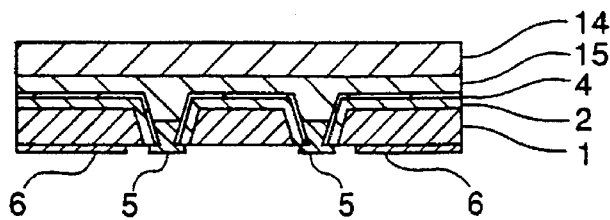

In this embodiment, however, a process is performed perfectly separating the thin polycrystalline Si layer 1 from the supporting substrate 8. In FIG. 4, reference numeral 13 designates a throughhole in the thin polycrystalline Si layer 1, reference numeral 14 designates a protecting glass, reference numeral 15 designates a transparent resin adhering the protecting glass 14 in the complete thin polycrystalline Si solar cell.

A description is given of the production method according to this second embodiment. The insulating film 9 is disposed on the entire surface of the supporting substrate 8 by reduced pressure CVD method or thermal oxidation as in the first embodiment. Furthermore, the Si layer is formed by reduced pressure CVD, and the grain diameter of the crystal is increased by zone-melting recrystallization, thereby producing the p type thin polycrystalline Si layer 1 (FIG. 4(a)).

The throughholes 13 of 100 μmφ are formed through the thin polycrystalline Si layer 1 by wet etching in a lattice pattern with a 1~2 mm interval (FIG. 4(b)). These throughholes 13 serve later as a path for the etchant during etching and a hole for forming an electrode. Next, the n type diffusion layer 2 is formed on the light receiving surface by the thermal diffusion (FIG. 4(c)), the insulating film 9 is etched and removed by hydrofluoric acid via the throughhole 13, and the supporting substrate 8 is separated from the thin polycrystalline Si layer 1 (FIG. 4 (d)). Because the through-hole 13 are formed on the substrate 8 in a lattice shape, the thin polycrystalline Si layer 1 is not broken even upon being separated from the Si supporting substrate 8.

On the upper part of the n type layer 2 formed on the thin polycrystalline Si layer 1 separated from the Si supporting substrate 8, the SiN film is produced by reduced pressure CVD as the anti-reflection film 4 (FIG. 4(e)), and in this state the hydrogen passivation is performed from the rear surface using the condition of the first embodiment (FIG. 4(f)).

The protection glass 14 is adhered at the light receiving surface side via the transparent resin (FIG. 4(g)), and, subsequently, the surface electrode 5 comprising Ag connected to the n type diffusion layer 2 and the rear surface electrode comprising Al connected to the p type thin polycrystalline Si layer 1 are respectively produced by screen printing or evaporation (FIG. 4(h)).

According to this embodiment, after the p type polycrystalline Si layer 1 and the n type diffusion layer 2 are produced employing the Si supporting substrate 8 as the underlying substrate, hydrogen passivation is performed after separating the Si supporting substrate 8, so that hydrogen ions can be implanted over the entire rear surface of the substrate. The surface of the solar cell is covered by the protection glass 14, so that the solar cell has sufficient strength without the supporting substrate.

While in this embodiment after the polycrystalline Si solar cell is attached to the protecting glass 14, the surface and rear surface electrodes are produced, the surface protecting glass 14 may be applied after the surface and rear surface electrodes are produced by reversing the order of the process of FIG. 4(g) and the process of FIG. 4(h).

A description is given of a method of producing a solar cell according to a third embodiment of the present invention. The hydrogen passivation is performed by the ion implantation at a low acceleration voltage in the above-described embodiments. However in this embodiment, the hydrogen passivation is performed by exposing the rear surface of the thin polycrystalline Si layer 1 to a hydrogen plasma. Other points are same as the above-described embodiments, so a description of those processes is omitted.

By performing the hydrogen passivation employing a hydrogen plasma, the uniformity of the passivation process in the wafer surface is improved, and a wafer having a large area can be processed efficiently.

Figure 5:
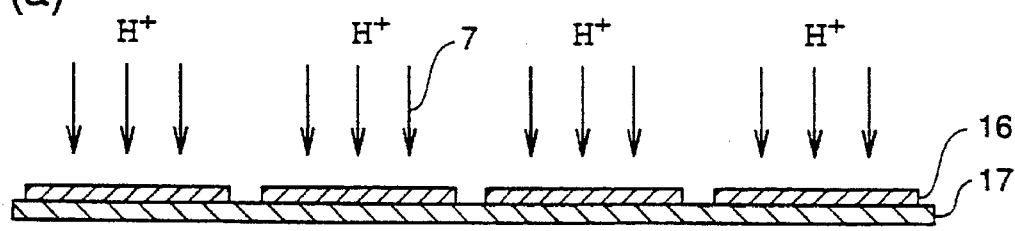
FIGS. 5(a) and 5(b) are conceptual views illustrating hydrogen passivation performed during an interconnecting step of a modularization process in a production method according to a third embodiment of the present invention.
Figure 5:
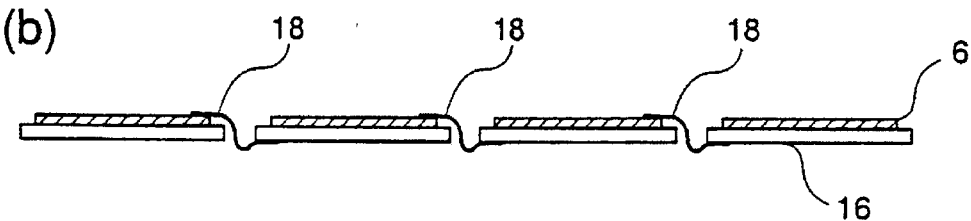

A description is given of a method of producing a solar cell according to the fourth embodiment of the present invention. FIGS. 5(a) and 5 (b) show performing hydrogen passivation of a plurality of a solar cells that are interconnected. In the figure, reference numeral 16 designates a solar cell including a pn junction, an anti-reflection film, and surface electrode. Reference numeral 17 designates an interconnecting jig for receiving the plurality of the solar cells 16, reference numeral 18 designates a tab electrode for connecting the electrodes of adjacent solar cells 16.

A description is given of the production method. The solar cell 16 corresponds to the chip of FIG. 1(h) and FIG. 4(f), and is disposed on the interconnecting jig 17 with its rear surface as an upper surface (FIG. 5(a)). This jig 17 is employed to connect the tab electrode 18 to the light receiving surface side of each solar cell 16. Hydrogen passivation is performed after connecting the tab electrode 18 to the light receiving surface. When several ion implantation apparatus are provided, corresponding to the area of the interconnecting jig 17, so as to increase the irradiation area, or the electrode area of the plasma CVD is increased to increase the area of plasma processing, sufficient hydrogen passivation is obtained. After hydrogen passivation, the electrode 6 is formed at the rear surface by printing Ag, and each solar cell 16 is interconnected by connecting the tab electrode 18 to the rear surface electrode 6 of the adjacent solar cell 16.

As described above, large volume production is enabled in the modularization process by hydrogen passivation employing the interconnecting jig 17.

In these embodiments, though a description is given of polycrystalline silicon for the photovoltaic layer, silicon can be employed.

In these embodiments, though passivation process is performed employing hydrogen, phosphorus can be employed.

As above-described, according to the production method of the solar cell in the present invention, a thin semiconductor crystalline film serving as a photovoltaic layer is formed on an underlying substrate, a prescribed portion of the underlying substrate is etched and removed so that the thin semiconductor crystalline film is exposed, and a passivation process for passivating dangling bonds is performed to the exposed thin semiconductor crystalline film. Thereby the thin photovoltaic layer can be produced, hydrogen passivation reaches the entire region in the film thickness direction of the photovoltaic layer, and a high efficiency solar cell is obtained.

According to a method of producing a solar cell in accordance with the present invention, a passivation process is performed before forming the rear surface electrode connected to the thin semiconductor crystalline film, so that passivation is not limited by the rear surface electrode, and a solar cell having more higher energy conversion efficiency is obtained.

According to a method of producing a solar cell in accordance with the present invention, a thin semiconductor crystalline film serving as a photovoltaic layer is formed on the underlying substrate via a semiconductor layer which can be selectively etched relative to the thin semiconductor crystalline film, a throughhole is formed at a prescribed portion of the thin semiconductor crystalline film to expose the insulating film, an etchant is brought into contact with the insulating film through the throughhole to etch and remove the insulating film, separating the thin semiconductor crystalline film from the underlying substrate, and a passivation process for passivating dangling bonds, is performed from the side opposite the light receiving surface of the thin semiconductor crystalline film. Thereby the thin photovoltaic layer can be produced, hydrogen passivation reaches the entire region in the film thickness direction of the photovoltaic layer, and the high efficiency solar cell is obtained.

According to a method of producing a solar cell in accordance with the present invention, a passivation process is performed before forming the rear surface electrode connected to the thin semiconductor crystalline film, that passivation is not limited by the rear surface electrode, and a solar cell having improved energy conversion efficiency is obtained.

According to a method of producing a solar cell in accordance with the present invention, the passivation process is performed by exposing the thin semiconductor crystalline film to a plasma ambient, whereby the uniformity of the passivation process on wafer surface is improved, and wafer of large area can be processed efficiently.

According to a method of producing a solar cell in accordance with the present invention, a plurality of solar cells are arranged for modularization and passivated so that large volume processing can be performed efficiently as a consequence of the modularization process.

What is claimed is:

1. A method for producing a solar cell comprising:

forming on an underlying substrate a thin semiconductor crystalline film as a photovoltaic layer;

exposing said thin semiconductor crystalline film by selectively etching and removing a portion of said underlying substrate;

passivating with hydrogen said thin semiconductor crystalline film where exposed by removal of a portion of said underlying substrate; and depositing a rear surface electrode covering and connected to the thin semiconductor crystalline film passivated with hydrogen.

2. The method of claim 1 comprising forming an etch stopping layer on aid underlying substrate before forming said thin semiconductor crystalline film for stopping etching during etching and removing said underlying substrate.

3. The method of claim 1 comprising passivating said thin semiconductor crystalline film in a hydrogen plasma.

4. The method of claim 1 comprising passivating said thin semiconductor crystalline film by implanting hydrogen ions.

* * * * *

UNITED STATES PATENT AND TRADEMARK OFFICE
CERTIFICATE OF CORRECTION

PATENT NO.   : 5,637,510
DATED        : June 10, 1997
INVENTOR(S)  : Morikawa et al.

It is certified that error appears in the above-indentified patent and that said Letters Patent is hereby corrected as shown below:

```
Column 8, Line 18, change "aid" to --said--.
```

Signed and Sealed this

Sixteenth Day of December, 1997

*Attest:*

BRUCE LEHMAN

*Attesting Officer*    Commissioner of Patents and Trademarks